(12) United States Patent
Kim et al.

(10) Patent No.: US 10,304,887 B2
(45) Date of Patent: May 28, 2019

(54) IMAGE SENSOR

(71) Applicant: Samsung Electronics Co., Ltd., Suwon-si, Gyeonggi-do (KR)

(72) Inventors: Han-seok Kim, Seoul (KR); Byung-jun Park, Yongin-si (KR); Hee-geun Jeong, Suwon-si (KR); Seung-joo Nah, Gwangju (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/862,396

(22) Filed: Jan. 4, 2018

(65) Prior Publication Data

US 2018/0286896 A1 Oct. 4, 2018

(30) Foreign Application Priority Data

Mar. 29, 2017 (KR) .......................... 10-2017-0040214

(51) Int. Cl.
*H01L 27/146* (2006.01)
(52) U.S. Cl.
CPC ...... *H01L 27/1463* (2013.01); *H01L 27/1464* (2013.01); *H01L 27/14636* (2013.01); *H01L 27/14643* (2013.01); *H01L 27/14667* (2013.01); *H01L 27/14694* (2013.01); *H01L 27/14627* (2013.01); *H01L 27/14689* (2013.01)
(58) Field of Classification Search
CPC .................................. H01L 27/146–27/14656
See application file for complete search history.

(56) References Cited

U.S. PATENT DOCUMENTS

| | | | |
|---|---|---|---|
| 8,378,399 B2 | 2/2013 | Maeda | |
| 8,395,194 B2 | 3/2013 | Yokoyama et al. | |
| 9,018,698 B2 | 4/2015 | Hsu et al. | |
| 9,419,039 B2 | 8/2016 | Ahmed et al. | |
| 9,437,636 B2 | 9/2016 | Kuboi | |
| 9,490,441 B2 | 11/2016 | Takimoto | |
| 2010/0201834 A1 | 8/2010 | Maruyama et al. | |
| 2012/0037960 A1* | 2/2012 | Yokoyama | H01L 27/14623 257/230 |
| 2015/0155327 A1* | 6/2015 | Kuboi | H01L 27/14612 348/273 |
| 2016/0204150 A1 | 7/2016 | Oh et al. | |

FOREIGN PATENT DOCUMENTS

| | | |
|---|---|---|
| JP | 4816768 B2 | 11/2011 |
| JP | 2012099743 A | 5/2012 |
| KR | 20150084854 A | 7/2015 |

* cited by examiner

*Primary Examiner* — Daniel P Shook
(74) *Attorney, Agent, or Firm* — Renaissance IP Law Group LLP

(57) ABSTRACT

A substrate includes a plurality of pixels arranged in a two-dimensional array structure and has a front side and a back side opposite to the front side. An interconnection is arranged on the front side of the substrate. An insulating layer, a color filter, and a micro-lens are arranged on the back side of the substrate. A pixel separation structure is disposed in the substrate. The pixel separation structure includes a conductive layer having a grid structure in a planar view of the image sensor and surrounds each of the plurality of pixels. A back side contact is vertically overlapped with and electrically connected to a grid point portion of the grid structure of the conductive layer of the pixel separation structure.

20 Claims, 19 Drawing Sheets

IMAGE SENSOR

CROSS-REFERENCE TO RELATED APPLICATION

This application claims priority under 35 U.S.C. § 119 to Korean Patent Application No. 10-2017-0040214, filed on Mar. 29, 2017, in the Korean Intellectual Property Office, the disclosure of which is incorporated by reference herein in its entirety.

TECHNICAL FIELD

The inventive concept relates to an image sensor.

DISCUSSION OF RELATED ART

Image sensors are semiconductor devices that convert an optical image to an electrical signal. Image sensors are generally classified into charge-coupled device (CCD) image sensors and complementary metal oxide semiconductor (CMOS) image sensors. As the semiconductor devices become increasingly integrated, the image sensors are also becoming more highly integrated. As the size of each pixel is reduced, occurrence of a defect due to a dark current or a charge accumulation in an interface increases.

SUMMARY

According to an exemplary embodiment of the present inventive concept, an image sensor is provided as follows. A substrate includes a plurality of pixels arranged in a two-dimensional array structure and has a front side and a back side opposite to the front side. An interconnection is arranged on the front side of the substrate. An insulating layer, a color filter, and a micro-lens are arranged on the back side of the substrate. A pixel separation structure is disposed in the substrate. The pixel separation structure includes a conductive layer having a grid structure in a planar view of the image sensor and surrounds each of the plurality of pixels. A back side contact is vertically overlapped with and electrically connected to a grid point portion of the grid structure of the conductive layer of the pixel separation structure.

According to an exemplary embodiment of the present inventive concept, an image sensor is provided as follows. A plurality of pixels each includes a photodiode disposed in a substrate and has a front side and a back side, the plurality of pixels being arranged in a first direction and a second direction to form an array structure in a planar view of the image sensor. A pixel separation structure penetrates the substrate. The pixel separation structure includes a plurality of sidewall insulating layers, and a conductive layer having a grid structure surrounding each of the plurality of sidewall insulating layers. A plurality of back side contacts each is partially inserted into one of a plurality of grid point portions of the grid structure of the conductive layer. The plurality of grid point portions of the grid structure of the conductive layer is non-overlapped in the first direction and in the second direction with the plurality of pixels.

According to an exemplary embodiment of the present inventive concept, an image sensor having a voltage source generating a voltage is provided as follows. A plurality of photodiodes is disposed in the substrate and arranged in a first direction and in a second direction intersecting the first direction in a planar view of the image sensor. A pixel separation structure penetrates the substrate, surrounds each of the plurality of photodiodes and separates the plurality of photodiodes from each other. An interconnection is electrically connected to the pixel separation structure and applied with the voltage having a negative voltage or a ground voltage. A plurality of back side contacts is arranged in a third direction intersecting the first direction and the second direction in the planar view of the image sensor and electrically connected to the interconnection through the pixel separation structure. The plurality of back side contacts each is partially inserted in a region of the pixel separation structure. The region of the pixel separation structure is surrounded by a predetermined number of the plurality of photodiodes.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
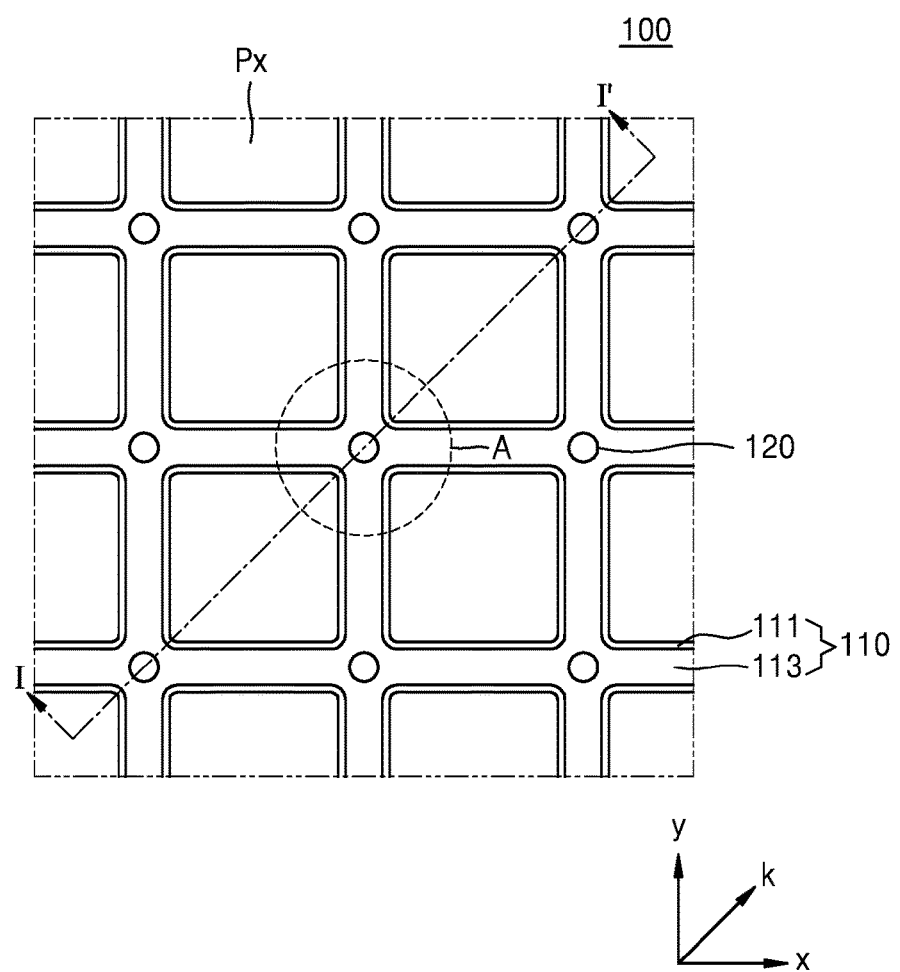
FIG. 1 is a plan view of a part of a pixel of an image sensor according to an exemplary embodiment of the present inventive concept.
Figure 2:
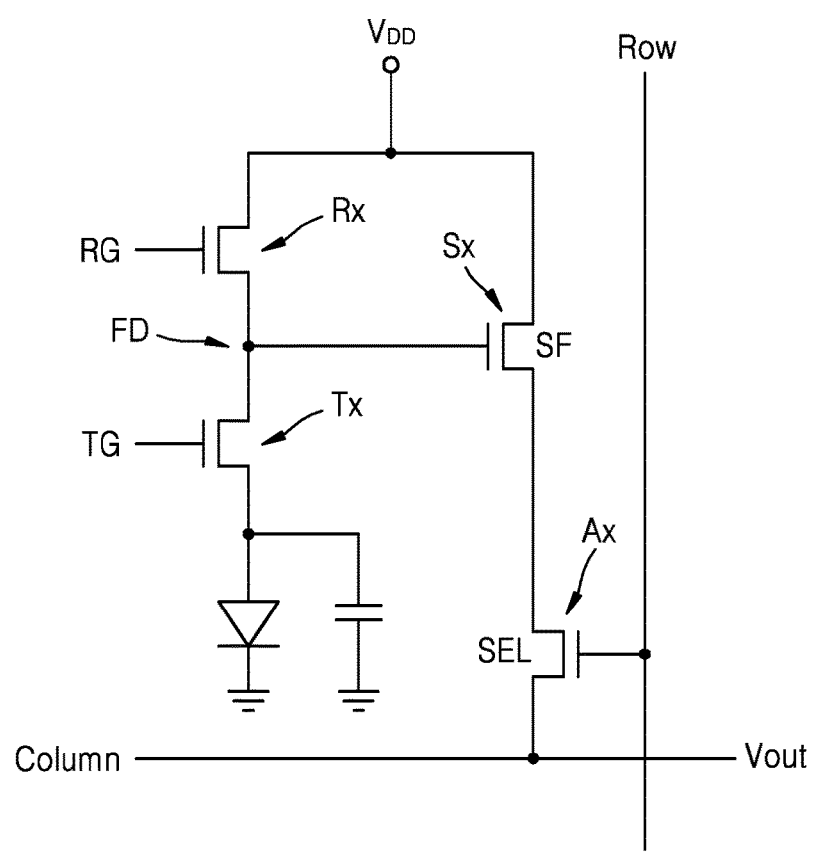
FIG. 2 is a circuit diagram of a pixel included in the pixel of the image sensor of FIG. 1 according to an exemplary embodiment of the present inventive concept.
Figure 3:
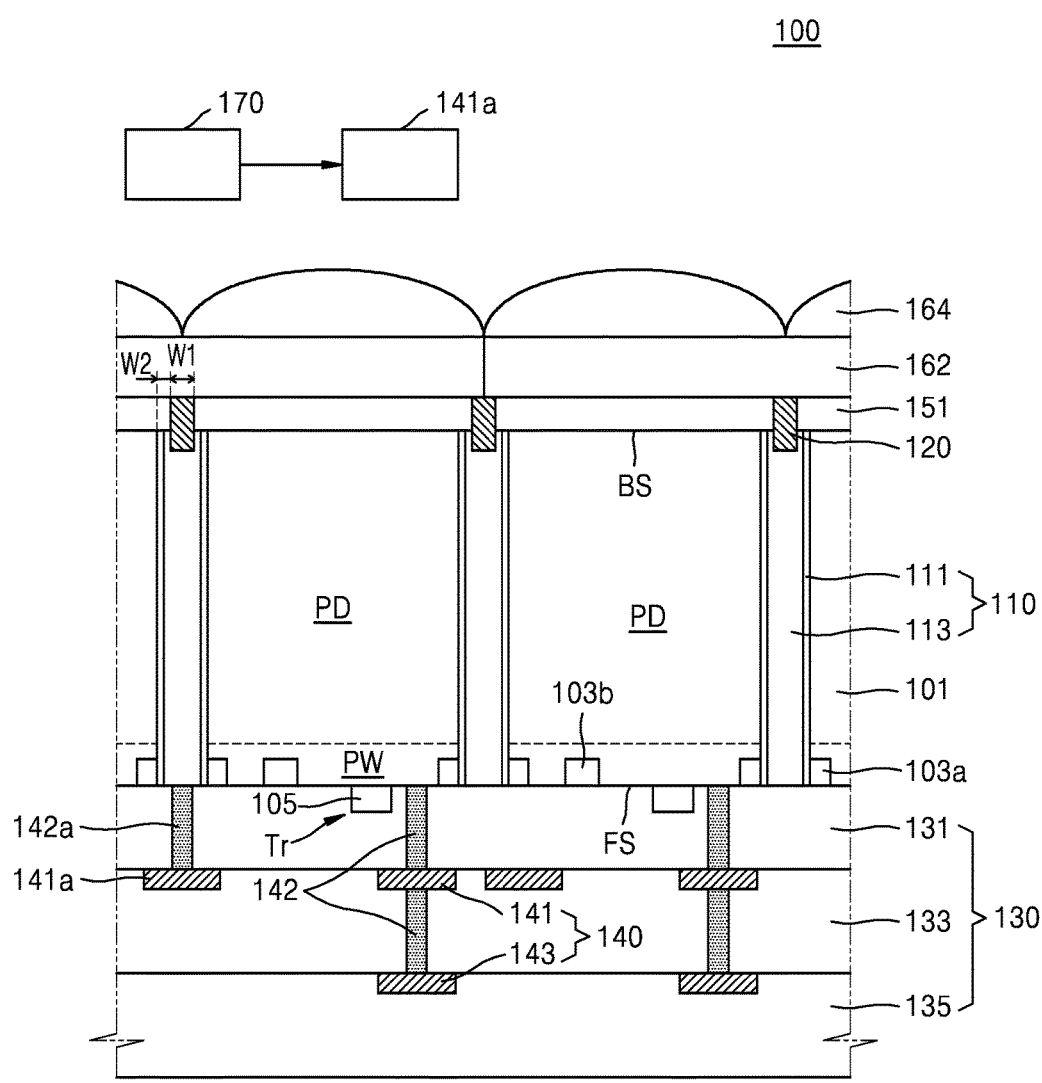
FIG. 3 is a cross-sectional view taken along line I-I' of FIG. 1 according to an exemplary embodiment of the present inventive concept.
Figure 4:
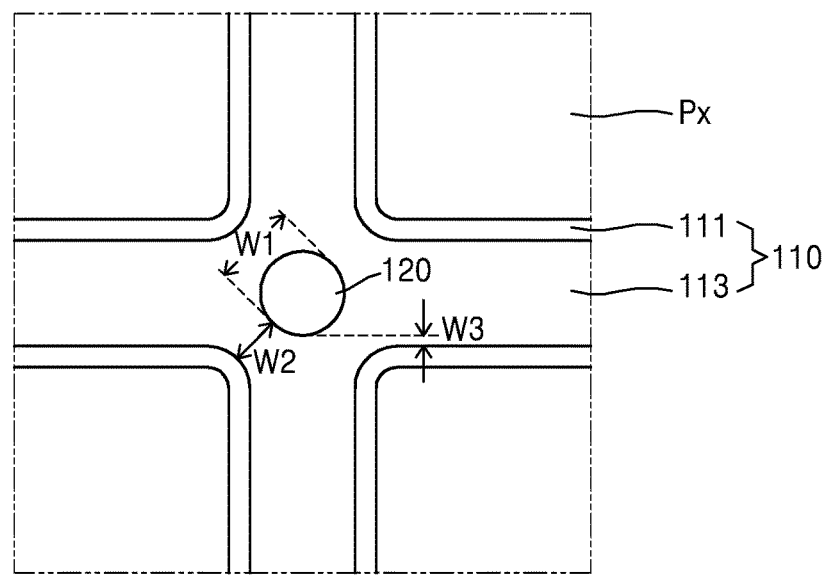
FIG. 4 is an enlarged view of a portion "A" of the image sensor of FIG. 1, according to an exemplary embodiment of the present inventive concept.

FIG. 1 is a plan view of a part of a pixel of an image sensor 100 according to an exemplary embodiment and schematically shows only a pixel Px, a pixel separation structure 110, and a back side contact 120 for convenience of understanding. As used herein, singular "a," "an," and "the" are intended to cover the plural forms as well, unless the context clearly indicates otherwise. FIG. 2 is a circuit diagram of the pixel Px included in the image sensor 100 of FIG. 1. FIG. 3 is a cross-sectional view taken along line I-I' of FIG. 1. FIG. 4 is an enlarged view of a portion "A" of the image sensor 100 of FIG. 1.

Referring to FIGS. 1 through 4, the image sensor 100 includes a substrate 101, a photodiode PD, the pixel separation structure 110, the back side contact 120, a multi-layered interconnection 140, a color filter 162, and a micro-lens 164.

The substrate 101 may include a silicon bulk wafer or an epitaxial wafer. The epitaxial wafer may include a crystalline layer grown on a bulk wafer by an epitaxial process. In this case, the substrate 101 may be formed of an epitaxial layer. The substrate 101 is not limited to the bulk wafer or the epitaxial wafer. For example, the substrate 101 may include various other types of wafers, such as a polished wafer, an annealed wafer, and a silicon-on-insulator (SOI) wafer.

The substrate 101 includes a front side FS and a back side BS. As shown in FIG. 3, the multi-layered interconnection 140 is arranged on the front side FS, and the color filter 162 and the micro-lens 164 are arranged on the back side BS. Light may be incident on the back side BS through the micro-lens 164. In this case, the image sensor 100 is a back side illumination (BSI) image sensor in which the light is incident on the back side BS of the substrate 101. If a combined structure of the photodiode PD and an interlayer insulating layer 130 are upside-down and attached to the micro-lens 164, light is incident on the front side FS of the substrate 101. In this case, the image sensor 100 may be a front side illumination (FSI) image sensor.

A pixel area or an active pixel sensor (APS) area including the pixel Px may be arranged in the substrate 101. The APS area may have a rectangular shape when viewed as a horizontal cross-section, but a shape of the APS area viewed as the horizontal cross section is not limited to the rectangular shape. FIG. 1 is a plan view viewed from a back side of the substrate 101, showing a part of the APS area. For the convenience of descriptions, an antireflection layer 151, the color filter 162, the micro-lens 164 as shown in FIG. 3 are omitted. A peripheral circuit area may be arranged outside the APS area.

The pixel Px may absorb the incident light, generating and accumulating electric charges corresponding to the amount of the incident light. The pixel Px includes the photodiode PD and a well area PW, which are formed in the substrate 101. The photodiode PD and the well area PW may be formed by performing an ion implantation process on the APS area with impurities having opposite polarities. For example, in a case that the substrate 101 is includes a P-type epitaxial wafer, the photodiode PD may be doped with N-type impurities, and the well area PW may be doped with P-type impurities. The photodiode PD may be relatively deeply formed in the substrate 101 from the front side FS to the back side BS. The well area PW may be relatively shallowly formed in the substrate 101 from the front side FS to the back side BS.

As shown in FIG. 2, the pixels Px includes the photodiode PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively.

The photodiode PD may include an N-type impurity area and a P-type impurity area. A drain of the transfer transistor Tx corresponds to a floating diffusion area FD. In addition, the floating diffusion area FD is a source of the reset transistor Rx. The floating diffusion area FD is electrically connected to a source follower gate SF of the source follower transistor Sx. The source follower transistor Sx is connected to the selection transistor Ax. The reset transistor Rx, the source follower transistor Sx, and the selection transistor Ax may be shared by pixels adjacent to each other, and thus a degree of integration may be increased.

An operation of the image sensor 100 will be described with reference to FIG. 2. In a light-blocking state, a source voltage $V_{DD}$ may be applied to a drain of the reset transistor Rx and a drain of the source follower transistor Sx to discharge electric charges remaining in the floating diffusion area FD. Then, if the reset transistor RX is turned off and external light is incident on the photodiode PD, electron-hole pairs may be generated in the photodiode PD. The holes move to the P-type impurity area, and the electrons move to the N-type impurity area. If the transfer transistor Tx is turned on, the electric charges are transferred to and accumulated in the floating diffusion area FD. A gate bias of the source follower transistor Sx may be changed in proportion to the accumulated amount of the electric charges, and a variation in source potential of the source follower transistor Sx may occur. In this regard, a signal caused by the electric charges may be read out through a column line CL by turning on the selection transistor Ax.

The pixel separation structure 110 is arranged in the substrate 101 to separate the pixel Px from each other. The pixel separation structure 110 has a mesh structure or a grid structure on an x-y plane, as shown in FIG. 1. In addition, a height of the pixel separation structure 110 correspond to a thickness of the substrate 101. As shown in FIG. 3, the pixel separation structure 110 connects the front side FS and the back side BS of the substrate 101. For example, the pixel separation structure 110 penetrates the substrate 101 to extend from the front side FS to the back side BS.

The pixel separation structure 110 includes a sidewall insulating layer 111 and a conductive layer 113 arranged in the sidewall insulating layer 111. The sidewall insulating layer 111 may be formed of an insulating material having a refractive index that is different from a refractive index of the substrate 101. For example, the sidewall insulating layer 111 may include a silicon oxide layer, a silicon nitride layer, or a silicon oxynitride layer. The sidewall insulating layer 111 extends from the front side FS of the substrate 101 to the back side BS of the substrate 101.

The conductive layer 113 may be formed of polysilicon or polysilicon doped with impurities but the material of the conductive layer 113 is not limited thereto. For example, the conductive layer 113 may be formed of any type of conductive material that may gap-fill a trench of the sidewall insulating layer 111. For example, the conductive layer 113 may be formed of at least one of a metal, a metal silicide, and a conductive material containing a metal.

Meanwhile, since the pixel separation structure 110 has the mesh structure that is a single unitary structure, the conductive layer 113 has the mesh structure as a single unitary structure. Accordingly, the conductive layer 113 is integrally connected structure and thus is an electrically single body structure. In other words, if electric power is applied to any portion of the conductive layer 113, the electric power may be supplied entirely to the conductive layer 113.

Since the pixel separation structure 110 is formed over the front side FS to the back side BS of the substrate 101, the pixel Px is separated from each other, thereby preventing crosstalk caused by obliquely incident light from occurring. The photodiode PD is in contact with and surrounded by one of the sidewall insulating layer 111 in plural of the pixel separation structure 110. In this case, the photodiode PD may have the same area as that of the pixel Px, and a light receiving area of the photodiode PD increases, thereby increasing a fill factor, and thus quantum efficiency (QE) may be increased.

The well area PW is arranged above the photodiode PD in the front side FS of the substrate 101. The transistors Tr described with reference to FIG. 2 may be arranged above the well area PW. For example, the transistors Tr may be disposed closer to the front surface FS in the well area PW. In FIG. 3, only a gate electrode 105 of the transistors is briefly illustrated. Shallow trench isolation (STI) layers 103a and 103b may be arranged in the well area PW to define an active area of each of the transistors Tr. The STI layers 103a and 103b each has a depth shallower than the sidewall insulating layer 111. The STI layer 103a and the sidewall insulating layer 111 may be integrally coupled to each other in some areas. For example, the pixel separation structure 110 may be coupled to the STI layer 103a by penetrating through the STI layer 103a. In this case, the sidewall insulating layer 111 is in contact with the STI layer 103a. Therefore, the STI layer 103a and the pixel separation structure 110 may have a "T" shape when viewed as a cross section between two neighbouring pixels.

In FIG. 3, the back side contact 120 is formed on the back side BS of the substrate 101. The back side contact 120 is connected to the conductive layer 113 of the pixel separation structure 110 through the antireflection layer 151 disposed on the back side BS of the substrate 101. A lower portion of the back side contact 120 is inserted into the conductive layer 113 but is not limited thereto. For example, the back side contact 120 has a lower surface that is in contact with an upper surface of the conductive layer 113. For example, the back side contact 120 may partially penetrate the antireflection layer 151. In this case, the back side contact 120 may be buried in the antireflection layer 151. An upper portion of the back side contact 120 protrudes from the conductive layer 113, and the upper portion of the back side contact 120 is surrounded by the antireflection layer 151. The back side contact 120 has an upper surface that is coplanar with an upper surface of the antireflection layer 151 at substantially the same height from the back side BS of the substrate 101.

The back side contact 120 may have a cylindrical shape. However, the shape of the back side contact 120 is not limited to a cylindrical shape. For example, the back side contact 120 may have various three-dimensional shapes, which will be described with reference to FIGS. 5A to 6. The back side contact 120 may be formed of tungsten (W). The material of the back side contact 120 is not limited to W. For example, the back side contact 120 may be formed of a metal material such as Al, TiN, and an Al compound including Ti or Ta.

The back side contact 120 is disposed on the back side of the substrate 101 and connected to the conductive layer 113 of the pixel separation structure 110, thereby effectively preventing an electrostatic discharge (ESD) bruise effect of the image sensor 100 from occurring. The ESD bruise defect refers to a defect such as a blemish that occurs in an image because charges generated by ESD or the like accumulate on an interface between the back side BS of the substrate 101 and the antireflection layer 151. The back side contact 120 connected to the conductive layer 113 of the pixel separation structure 110 is formed on the back side BS of the substrate 101, and thus charges accumulated on the interface between the back side BS and the antireflection layer 151 may be discharged through the back side contact 120 and the conductive layer 113. Specifically, the conductive layer 113 of the pixel separation structure 110 may be electrically connected to an interconnection layer 141a disposed on the front surface FS of the substrate 101, and a ground voltage or a negative voltage may be applied to the interconnection layer 141a, and thus charges accumulated on the interface may be discharged to the interconnection layer 141a through the back side contact 120 and the conductive layer 113. For example, the conductive layer 113 of the pixel separation structure 110 is electrically connected to the interconnection layer 141a through a vertical contact 142a, As a result, the image sensor 100 of the present embodiment may effectively remove the ESD bruise defect problem by using the back side contact 120 connected to the conductive layer 113.

As shown in FIG. 3, the image sensor 100 includes a voltage source 170 generating a voltage including the negative voltage or the ground voltage. For example, the voltage source 170 may be electrically connected to the interconnection layer 141a so that the charges accumulated on the interface between the back side BS of the substrate 101 and the antireflection layer 151 are removed by the voltage source 170.

As shown in FIG. 1, the back side contact 120 is disposed in a grid point portion of the pixel separation structure 110 formed in a two-dimensional grid structure on an x-y plane, for example, in a planar view of the image sensor 100. For example, the pixel Px is arranged in a two-dimensional array structure in the planar view of the image sensor 100, and the pixel Px has a rectangular structure on the x-y plane. For example, the pixel Px is arranged in a first direction (x-direction) and in a second direction (y-direction) to form the two-dimensional array structure. In this case, the back side contact 120 in plural is arranged in a third direction (k-direction) intersecting the first direction and the second direction. In an exemplary embodiment, the third direction is parallel to the line I-I' of FIG. 1.

In addition, the pixel Px is separated from each other by the pixel separation structure 110 of the two-dimensional grid structure. The back side contact 120 is disposed in a grid point portion of the pixel separation structure 110 where vertexes of a predetermined number of the pixel Px may be adjacent to each other. For example, the predetermined number is four. In this case, four pixels surround the grid point portion of the pixel separation structure 110. The four pixels, for example, are arranged in two rows and two columns. Each row includes two pixels of the four pixels along the first direction. Each column includes two pixels of the four pixels along the second direction. The grid point portion of the pixel separation structure 110 is non-overlapped in the first direction and in the second direction with the four pixels.

Since the back side contact 120 is disposed in the grid point portion of the pixel separation structure 110, a process margin forming the back side contact 120 may be secured. For example, as shown in FIG. 4, the back side contact 120 having a first width W1 is disposed in the grid point portion of the pixel separation structure 110, and the back side contact 120 is apart from the sidewall insulating layer 111 adjacent to the back side contact 120 by an interval of a second width W2. On the other hand, if the back side contact 120 is formed on a side portion of the pixel separation structure 110, i.e., a portion adjacent to a side of the pixel Px, the back side contact 120 is apart from the sidewall insulating layer 111 by an interval of a third width W3. However, the third width W3 is smaller than the second width W2 so that a process margin for forming the back side contact 120 is not sufficient.

The width W1 of the back side contact 120 is less than the width of the conductive layer 113, as shown in FIG. 3 or FIG. 4. The present inventive concept, however, is not limited thereto. For example, the width W1 of the back side contact 120 may be substantially the same as the width of the conductive layer 113 or greater than the width of the conductive layer 113. The back side contact 120 needs to be formed not to be in contact with the substrate 101 or the photodiode PD. In other words, at least one portion of the back side contact 120 may escape the conductive layer 113 but should not escape the sidewall insulating layer 111. For example, the lower portion of the back side contact 120 needs to be surrounded by the sidewall insulating layer 111.

The back side contact 120 may be disposed in the grid point portion of the pixel separation structure 110. For example, the grid portion of the pixel separation structure 110 receives the back side contact 120. The present inventive concept, however, is not limited thereto. For example, the back side contact 120 need not be located at each of the grid point portion in plural of the pixel separation structure 110. The back side contact 120 may be disposed only at some of the grid point portion in plural. In this case, a number of the back side contact 120 in plural is smaller than a number of the grid point portion in plural.

Further, if the side portions of the pixel separation structure 110 have a sufficiently great width, the back side contact 120 may be disposed at a side portion of the pixel separation structure 110. In this case, the back side contact 120 may be disposed between sides of two pixels adjacent to each other.

Unlike FIG. 1 in which the back side contact 120 is formed in a grid structure over the pixel separation structure 110, if a back side contact has a grid structure, an incident light may be blocked or reflected by the back side contact so that QE may be significantly lowered. For example, in a case in which light is obliquely incident on a pixel, the back side contact portion disposed on the pixel separation structure 110 may also contribute to QE. Accordingly, when the back side contact 120 is formed only at the grid point portion of the pixel separation structure 110, as in the image sensor 100 of the present embodiment, by roughly checking QE with an area of the back side contact with respect to an area of the APS area, an area ratio of the back side contact may be less than several percent. In contrast, if the back side contact is formed in a grid structure similar to the pixel separation structure 110, the area ratio of the back side contact may be equal to or greater than 20%. As a result, QE of the image sensor 100 of the present embodiment in which the back side contact 120 is formed only at the grid point portion may be remarkably high, as compared with the image sensor in which the back side contact is formed in the grid structure.

The interlayer insulating layer 130 and the multi-layered interconnection 140 are disposed on the front surface FS of the substrate 101. The interlayer insulating layer 130 includes multiple layers—a first insulating layer 131, a second insulating layer 133 and a third insulating layer 135. The number of layers of the interlayer insulating layer 130 is not limited to three layers. For example, the interlayer insulating layer 130 may include four or more layers. The multi-layered interconnection 140 includes a first interconnection layer 141 on the first insulating layer 131 and a second interconnection layer 143 on the second insulating layer 133. The number of layers of the multi-layered interconnection 140, however, is not limited to two layers. For example, the multi-layered interconnection 140 may include three or more interconnection layers based on the number of layers of the interlayer insulating layer 130. The multi-layered interconnection 140 may further include the interconnection layer 141a.

The first interconnection layer 141, the second interconnection layer 143 and the interconnection layer 141a of the multi-layered interconnection 140 may be electrically connected to each other through vertical contacts 142 and 142a and may be electrically connected to active areas of the substrate 101 and the conductive layer 113 of the substrate 101. The multi-layered interconnection 140 may extend to a peripheral circuit area outside the APS area. Meanwhile, reference numeral 'a' may be attached to the interconnection layer 141a and the vertical contact 142a connected to the conductive layer 113 of the pixel separation structure 110 to distinguish the first interconnection layer 141 and the vertical contact 142.

The antireflection layer 151, the color filter 162, and the micro-lens 164 are disposed on the back side BS of the substrate 101. The antireflection layer 151 may prevent reflection of light incident on the back side BS of the substrate 101 and may be formed of, for example, hafnium oxide (HfOx). However, the material of the antireflection layer 152 is not limited thereto. The color filter 162 may be arranged in an array structure corresponding to the pixel P. In an exemplary embodiment h filter 162 may have a Bayer pattern structure including a red filter, a green filter, or a blue filter. In an exemplary embodiment, the color filter 162 may include a yellow filter, a magenta filter, or a cyan filter. In addition, the color filter 162 may further include a white filter.

A peripheral circuit area (not shown) may be disposed outside the APS area. A plurality of CMOS circuits for signal processing of an image may be disposed in the peripheral circuit area. A voltage application device may be disposed in the peripheral circuit area. The voltage application device may apply a negative voltage or a ground voltage suitable for charge removal to the conductive layer 113 of the pixel separation structure 110 through the interconnection layer 141a. In addition, the applied ground voltage or negative voltage may be applied to the back side contact 120 through the conductive layer 113. Accordingly, charges accumulated or remaining on the interface between the back side BS of the substrate 101 and the antireflection layer 151 may be discharged through the back side contact 120, the conductive layer 113, and the first interconnection layer 141a, and thus the ESD bruise defect problem caused by accumulation of charges on the interface may be effectively removed.

Figure 5A:
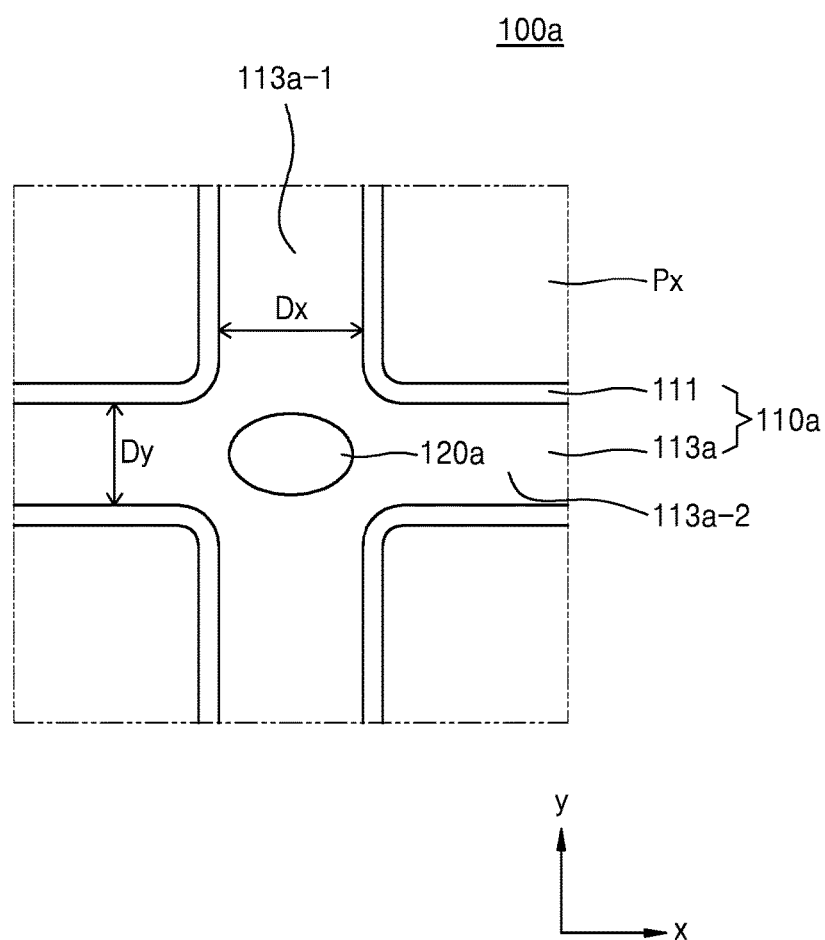
FIGS. 5A through 5C are plan views of image sensors according to an exemplary embodiment according to an exemplary embodiment of the present inventive concept.
Figure 5B:
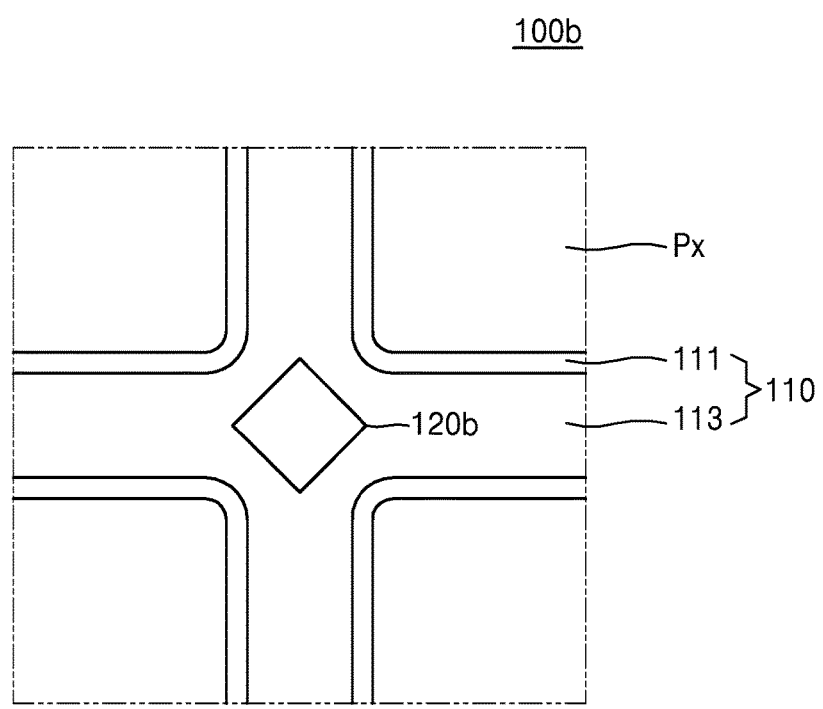
Figure 5C:
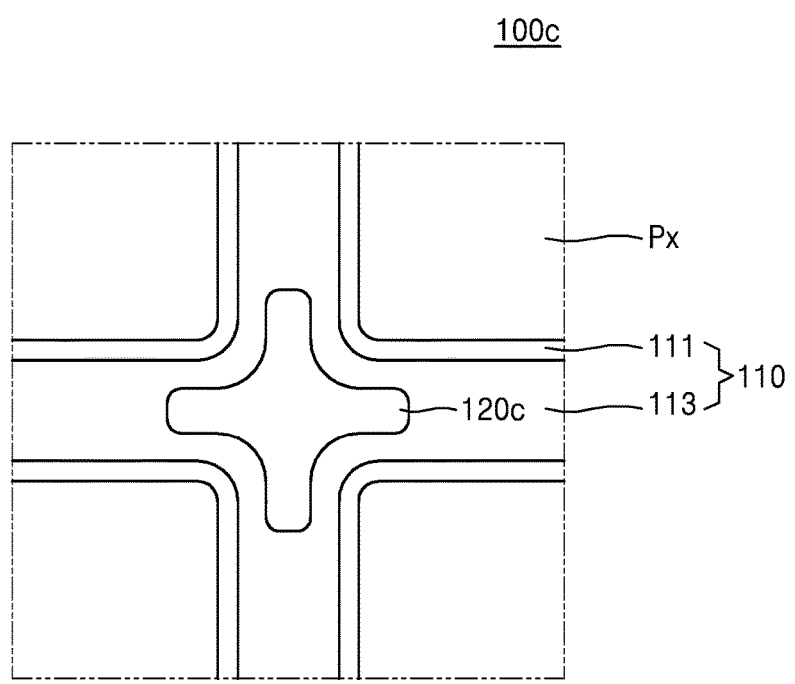

FIGS. 5A through 5C are plan views of image sensors 100a, 100b, and 100c according to an exemplary embodiment. The image sensors 100a, 100b and 100c are substantially the same as the image sensor 100 of FIGS. 1 to 4, except the shape of the back side contact 120. The plan views of FIGS. 5A through 5C correspond to FIG. 4.

Referring to FIG. 5A, the image sensor 100a may have a back side contact 120a different from the image sensor 100 of FIG. 4. For example, the back side contact 120a has an elliptical shape with its long axis in a first direction (x direction). The image sensor 100a has a pixel separation structure 110a different from the image sensor 100 of FIG. 4. The first pixel separation structure 110a a first side portion 113a-1 extending in a second direction (y direction) and a second side portion 113a-2 extending in the first direction (x direction). The first side portion 113a-1 has a first side width Dx, and the second side portion 113a-2 has a second side width Dy. The first side width Dx is greater than the second side width Dy. Also, a width in the first direction (x direction) may be greater than a width in the second direction (y direction) in a grid point portion of the pixel separation structure 110a. In this case, the back side contact 120a has an elongated ellipse in the first direction (x direction). The present inventive concept is not limited thereto, a back side contact may be formed in a circular shape as in the image sensor 100 of FIG. 4.

Referring to FIG. 5B, the image sensor 100b has a back side contact 120b different from the image sensor 100 of FIG. 4. For example, the back side contact 120b has a rectangular shape. In addition, the back side contact 120b is positioned such that vertexes of the rectangle are directed in parallel to the sides of the pixel separation structure 110. The shape of the back side contact 120b is not limited to a square. For example, the back side contact 120b may have various polygonal shapes such as triangular, pentagonal, and hexagonal.

Referring to FIG. 5C, the image sensor 100c has a back side contact 120c different from the image sensor 100 of FIG. 4. For example, the back side contact 120c has a cross shape. In addition, the back side contact 120c is arranged such that cross-shaped protruding portions are directed in parallel to side portions of the pixel separation structure 110. The cross shape of the back side contact 120c is wider at a central portion than an end portion.

The present inventive concept is not limited thereto. For example, a back side contact disposed at a grid point portion of a pixel separation structure and connected to a conductive layer may have various shapes. In addition, in FIGS. 5A to 5C, only a shape of an upper surface of the back side contact is described, but a three-dimensional shape of the back side contact may basically have a column shape. Accordingly, the three-dimensional shape of the back side contact will be described with reference to FIGS. 6A to 6C.

Figure 6A:
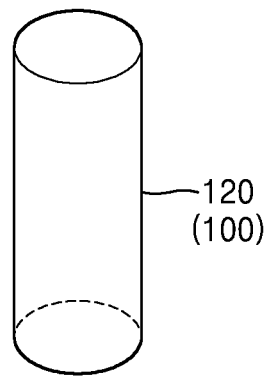
FIGS. 6A through 6C are perspective views of 3D structures of a back side contact formed in the image sensor of FIG. 1 according to an exemplary embodiment of the present inventive concept.
Figure 6B:
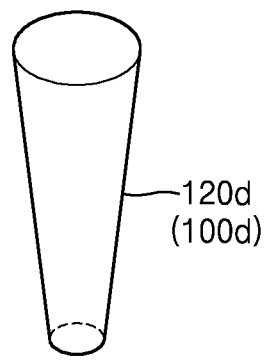
Figure 6C:
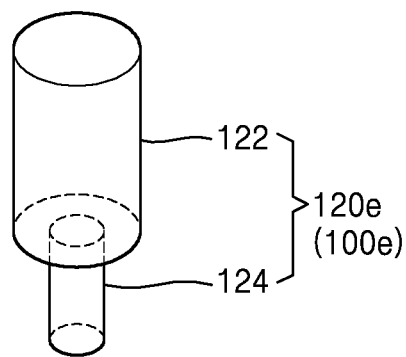

FIGS. 6A through 6C are perspective views of 3D structures of the back side contact 120 formed in the image sensor 100 of FIG. 1.

Referring to FIG. 6A, the image sensor 100 includes the back side contact 120 having a three-dimensional cylindrical shape. The three-dimensional shape of the back side contact 120 is not limited to a cylinder. For example, the back side contacts 120a, 120b, 120c illustrated previously in FIGS. 5A through 5C may also have columnar shapes. In other words, the back side contact 120a of FIG. 5a has an elliptical column shape, the back side contact 120b of FIG. 5B has a quadrangular column shape, and the back side contact 120c of FIG. 5C may have a cross column shape. If a top surface of the back side contact has a polygonal shape such as a triangle and a pentagon, the three-dimensional shape of the back side contact may have a polygonal column shape such as a triangular cylinder and a pentagonal cylinder.

Referring to FIG. 6B, an image sensor 100d includes a back side contact 120d having a circular truncated cone shape three dimensionally. In other words, the back side contact 120d has a shape in which an area becomes narrower toward the bottom. If an upper surface of the back side contact 120d is an ellipse, the back side contact has a shape of an elliptical truncated cone. If the upper surface of the back side contact 120d has a polygonal shape such as a triangle, a rectangle and a pentagon, the back side contact 120d may have a shape of a polygonal truncated cone, such as a triangular truncated cone, a quadrangular truncated cone, and a pentagonal truncated cone.

Referring to FIG. 6C, the image sensor 100e includes a back side contact 120e having an upper head portion 122 having a large area and a lower insertion portion 124 having a small area. The upper head portion 122 may be a portion located on an upper surface of the conductive layer 113 of the pixel separation structure 110. The lower insertion portion 124 may be a portion inserted into the conductive layer 113. This back side contact 120e may have a shape similar to a tack. A vertical cross-section of the back side contact 120e has a 'T' shape. The upper head portion 122 is not limited to a cylinder, but may have a shape such as an elliptical column, a polygonal column, and a cross column, as described with reference to FIG. 6A. Further, as described with reference to FIG. 6B, the upper head portion 122 may have a shape such as a truncated cone, an elliptical truncated cone, and a polygonal truncated cone. Furthermore, the shape of the insertion portion 124 is not limited to the cylinder.

In an exemplary embodiment, a seam may be present in a central portion of the conductive layer 113 of the pixel separation structure 110 and the insertion portion 124 of the back side contact 120e may be easily inserted in the conductive layer 113.

FIGS. 7, 8A and 8B, and 9A through 9E are cross-sectional views of an image sensor 100e, an image sensor 100f, an image sensor 100g, an image sensor 100h, an image sensor 100i, an image sensor 100j, an image sensor 100k, and an image sensor 100l according to an exemplary embodiment. FIGS. 7, 8A and 8B, and 9A through 9E correspond to FIG. 3.

Figure 7:
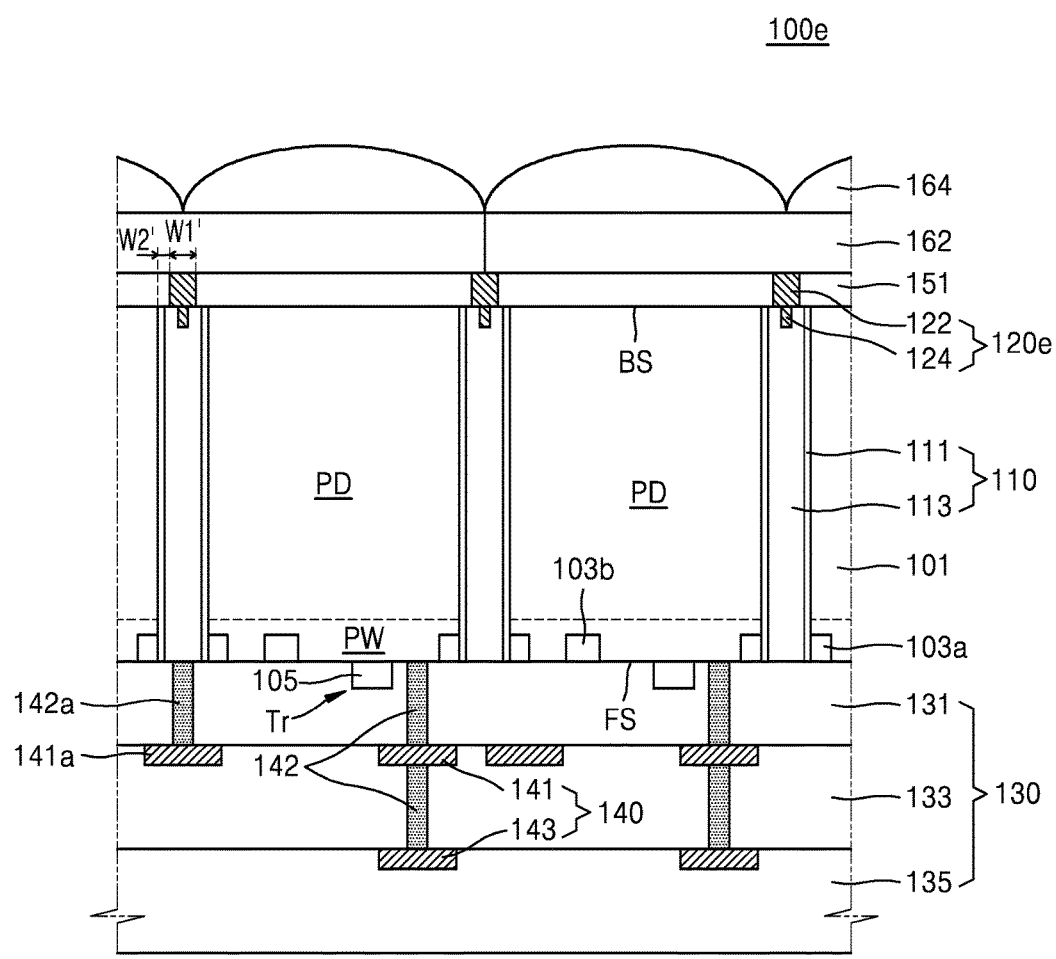
FIG. 7 is a cross-sectional view of an image sensor according to an exemplary embodiment of the present inventive concept.

Referring to FIG. 7, the image sensor 100e includes a back side contact 120e different from the image sensor 100 of FIG. 3. For example, the back side contact 120e has the tack shape of FIG. 6C. The back side contact 120 includes the upper head portion 122 and the lower insertion portion 124. The upper head portion 122 is located on an upper surface of the conductive layer 113 of the pixel separation structure 110, and the inserting portion 124 is inserted into the conductive layer 113.

The upper head portion 122 has a first width W1' that may be greater than the first width W1 of the back side contact 120 of FIG. 3. A second width W2' between the sidewall insulating layer 111 and the upper head portion 122 may be smaller than the second width W2, which is a separation distance of the back side contact 120 of FIG. 3 from the sidewall insulating layer 111.

Figure 8A:
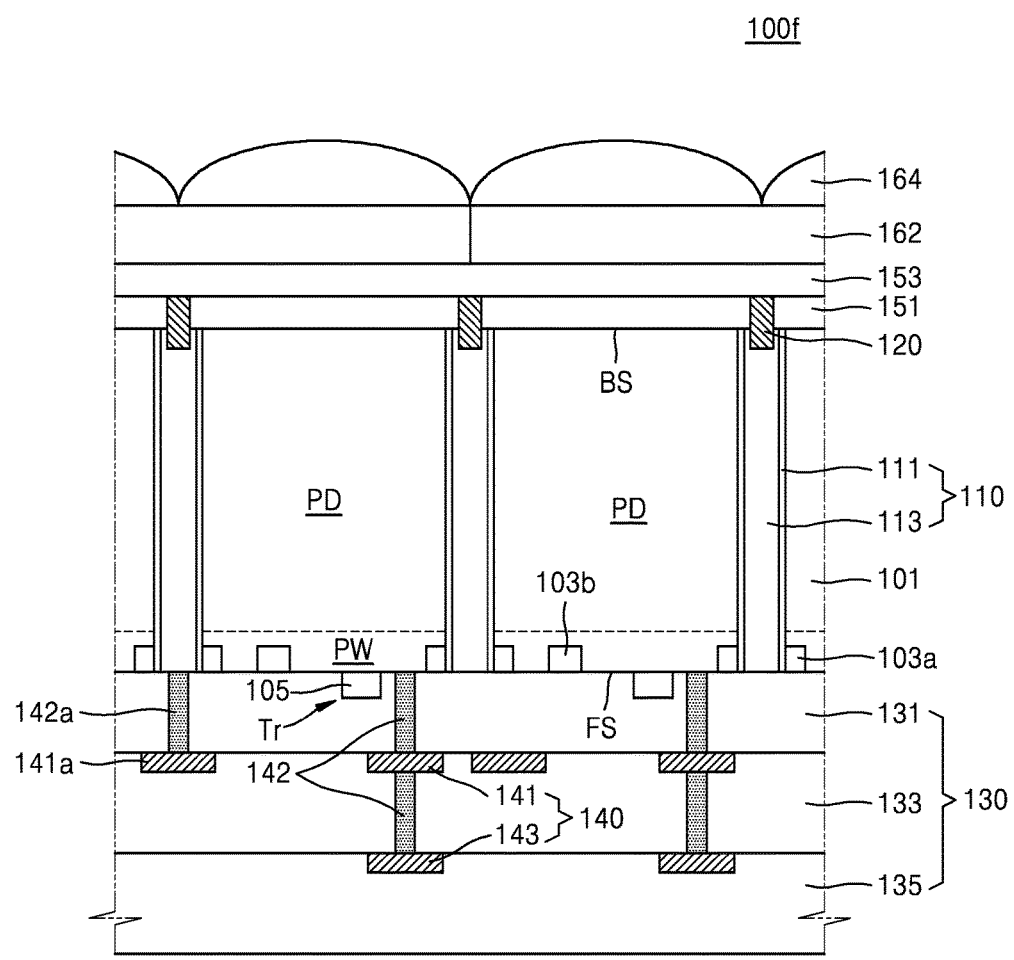
FIGS. 8A and 8B are cross-sectional views of image sensors according to an exemplary embodiment of the present inventive concept.

Referring to FIG. 8A, the image sensor 100f further includes a back side insulating layer 153 on the back side BS of the substrate 101 compared with the image sensor 100 of FIG. 3. For example, the back side insulating layer 153 is disposed on the antireflection layer 151. The back side insulating layer 153 may serve as an insulating layer for planarization, for example. After forming the antireflection layer 151, the back side insulating layer 153 may be formed by applying a transparent insulating material on the entire surface of the antireflection layer 151 and performing a planarization process such as a chemical mechanical polishing (CMP) process thereon. The back side insulating layer 153 may be formed to form the color filter 162 and the micro-lens 164 on the upper surface of the back side insulating 153 at a uniform height from the back side BS of the substrate 101.

Although not shown, a passivation layer may further be formed on the upper surface of the back side insulating layer 153 for protecting the back side insulating layer 153 and components below the back side insulating layer 153.

Figure 8B:
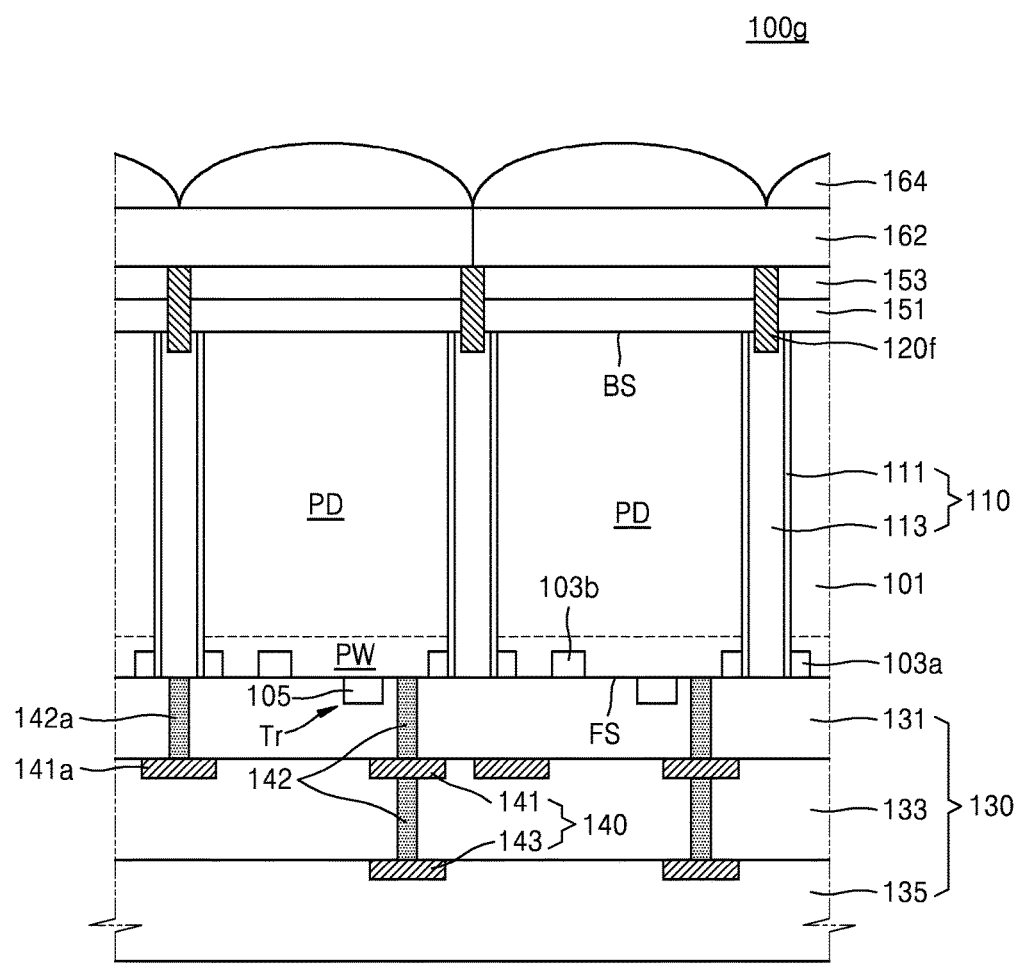

Referring to FIG. 8B, the image sensor 100g includes a back side contact 120f different from the image sensor 100f of FIG. 8A. For example, the back side insulating layer 153 is formed on the antireflection layer 151 and the back side contact 120f penetrates the antireflection layer 151 and the back side insulating layer 153. A lower portion of the back side contact 120f is inserted into the conductive layer 113 of the pixel separation structure 110.

In an exemplary embodiment, the back side contact 120f need not completely penetrate the back side insulating layer 153 so that the back side contact 120f may penetrate partially the back side insulating layer 153. For example, an upper portion of the back side contact 120f may protrude from the antireflection layer 151, and a side surface and an upper surface of the protruded upper portion may be covered with the back side insulating layer 153.

Figure 9A:
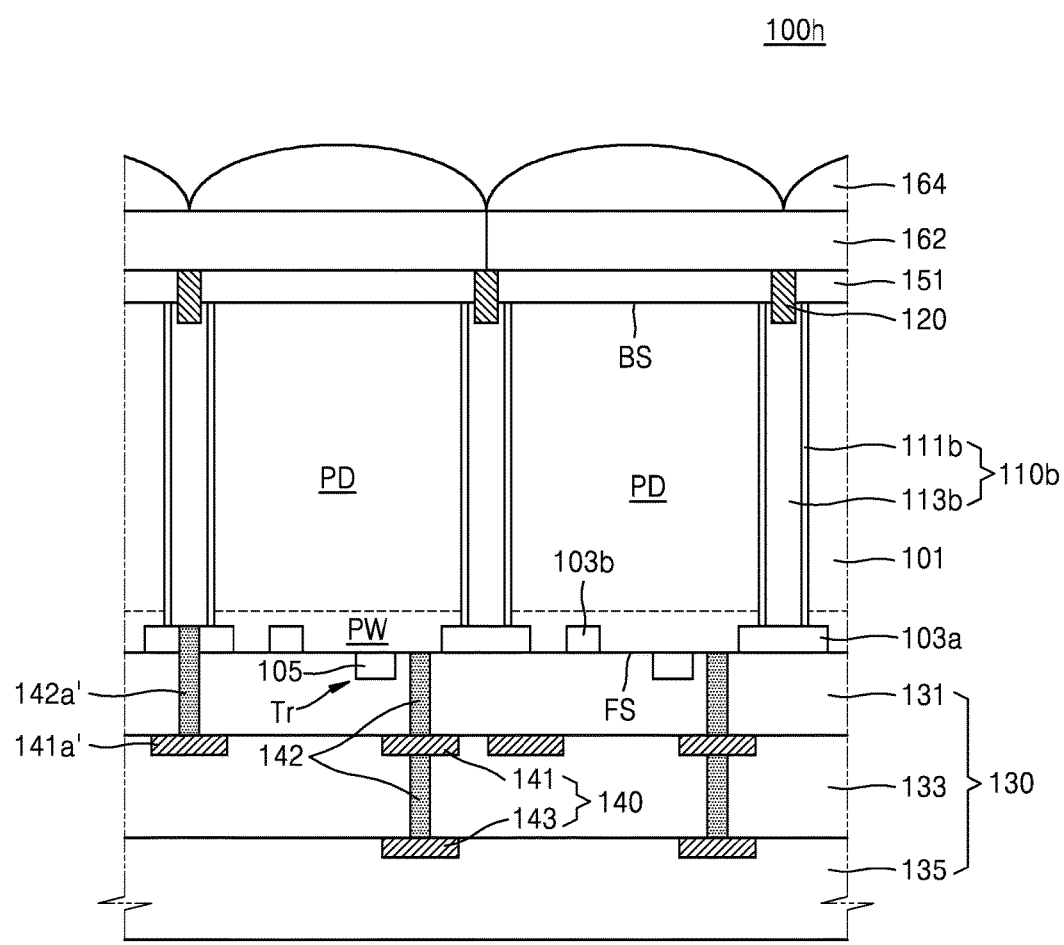
FIGS. 9A and 9E are cross-sectional views of image sensors according to an exemplary embodiment of the present inventive concept.

Referring to FIG. 9A, the image sensor 100h includes a pixel separation structure 110b different front the image sensor 100 of FIG. 3. For example, the pixel separation structure 110b need not penetrate the STI layer 103a. The pixel separation structure 110b is in contact with an upper surface of the STI layer 103a. In addition, as the pixel separation structure 110b is coupled to the STI layer 103a on the upper surface of the STI layer 103a, a vertical contact 142a' penetrates the first insulating layer 131 and the STI layer 103a to connect a first interconnection layer 141a' and the conductive layer 113b of the pixel separation structure 110b may have a structure that the vertical contact 142a'. Thus, a length of the vertical contact 142a' of the image sensor 100h may be greater than the vertical contact 142a of the image sensor 100 of FIG. 3.

The back side contact 120 is connected to the conductive layer 113b of the pixel separation structure 110b through the antireflection layer 151 at the back side BS of the substrate 101. Further, the pixel separation structure 110b may be arranged in a two-dimensional grid structure on an x-y plane (for example, in a planar view of the image sensor 100h), and the back side contact 120 may be arranged in a grid point portion of the pixel separation structure 110b.

The image sensor 100 of FIG. 3 may be fabricated by firstly forming the STI layer 103a on the substrate 101 and then forming the pixel separation structure 110 on the STI layer 103a. On the other hand, the image sensor 100h of FIG. 9A may be fabricated by firstly forming the pixel separation structure 110b on the substrate 101, and then forming the STI layer 103a on the pixel separation structure 110b. Meanwhile, the image sensor 100 of FIG. 3 and the image sensor 100h of FIG. 9A may be fabricated by forming deep trenches in the front side FS of the substrate 101 and filling the deep trenches with the sidewall insulating layers 111 and 111b and the conductive layers 113 and 113b to form the pixel separation structures 110 and 110b.

Figure 9B:
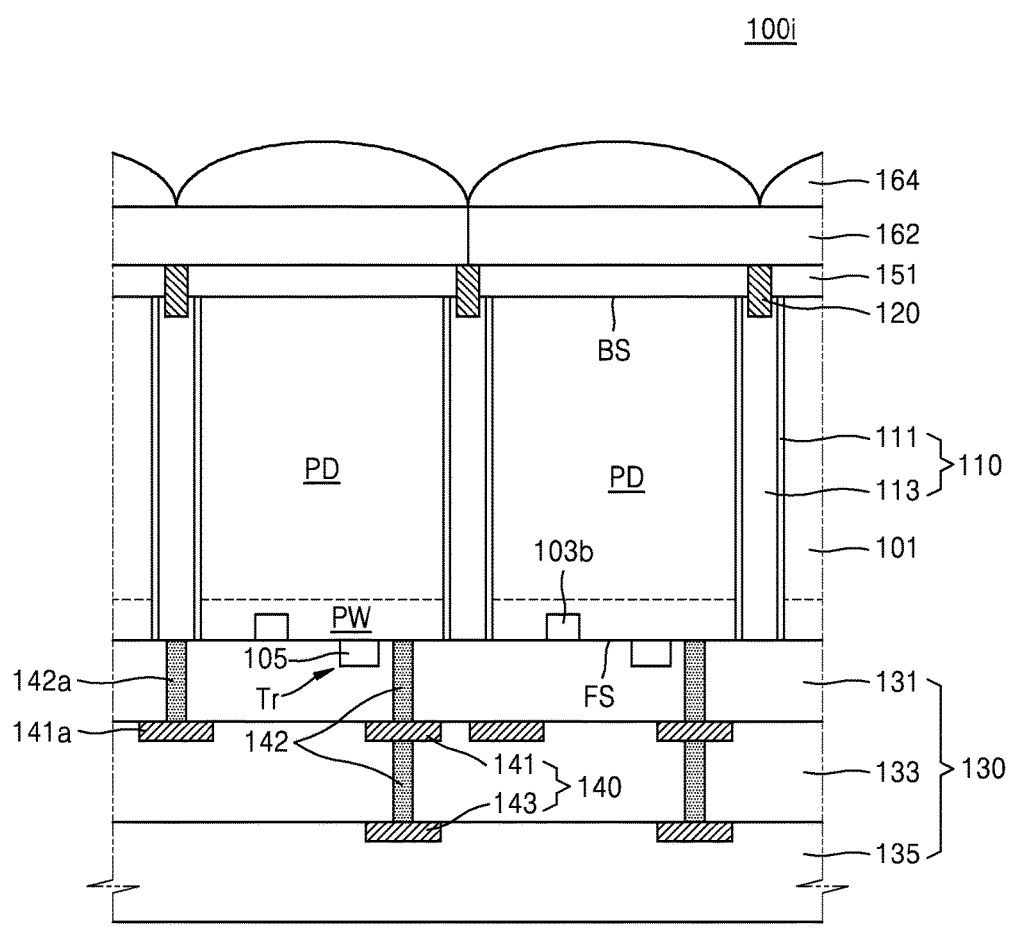

Referring to FIG. 9B, the image sensor 100i is different from the image sensor 100 of FIG. 3. For example, the pixel separation structure 110 is not coupled to the STI layer 103a of FIG. 3. The STI layer 103a of FIG. 3 is absent in the image sensor 100i of FIG. 9B. The pixel separation structure 110 may be also formed by forming a deep trench in the front side FS of the substrate 101 and filling the deep trench with the sidewall insulating layers 111 and 111b and the conductive layers 113 and 113b.

The back side contact 120 is connected to the conductive layer 113 of the pixel separation structure 110 through the antireflection layer 151 at the back side BS of the substrate 101. In addition, the back side contact 120 may be disposed at a grid point portion of the pixel separation structure 110.

Figure 9C:
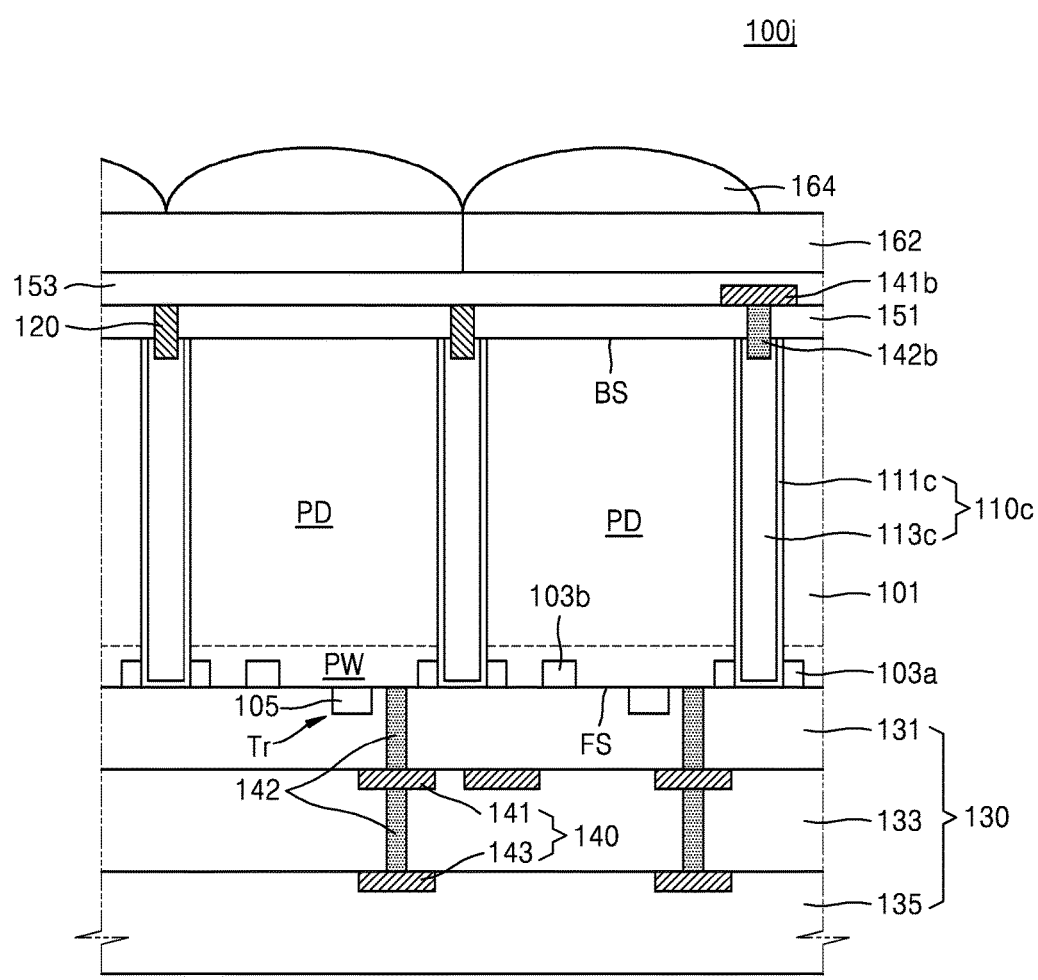

Referring to FIG. 9C, the image sensor 100j includes a pixel separation structure 110c, a first interconnection layer 141b and a vertical contact 142b different from the image sensor 100 of FIG. 3. For example, the pixel separation structure 110c is combined with the STI layer 103a. For example, the pixel separation structure 110c is in contact with the STI layer 103a. The pixel separation structure 110c includes a sidewall insulation layer 111c a conductive layer 113c. The sidewall insulation layer 111c covers a side surface and a bottom surface of the conductive layer 113c. For example, the sidewall insulation layer 111c is in contact with the side surface of the conductive layer 113c and the bottom surface of the conductive layer 113c. The sidewall insulation layer 111c of the pixel separation structure 110c is exposed on the front side FS of the substrate 101 instead of the conductive layer 113c.

The image sensor 100j further includes the first interconnection layer 141b and the vertical contact 142b for applying a negative voltage or a ground voltage to the conductive layer 113c of the pixel separation structure 110c. The first interconnection layer 141b and the vertical contact 142b are formed on the back side BS of the substrate 101. The first interconnection layer 141b and the vertical contact 142b may be disposed at an outer portion of the APS area to avoid an interfere with a path of light incident on the back side BS. The image sensor 100j further includes a back side insulating layer 153 disposed between the antireflection layer 151 and the color filter 162. The back side insulating layer 153 may be, for example, an insulating layer for planarization.

The image sensor 100j may be fabricated by forming a deep trench extending from the back side BS to the front side FS of the substrate 101 and filling the deep trench with the sidewall insulating layer 111c and the conductive layer 113c to form the pixel separation structure 110c. For example, the STI layers 103a and 103b may be firstly formed on the front side FS of the substrate 101, and the multi-layered interconnection 140 may be formed on the front side FS of the substrate 101. Next, a deep trench may be formed in the back side BS of the substrate 101 and may be filled with the sidewall insulating layer 111c and the conductive layer 113c to form the pixel separation structure 110c. Next, the antireflection layer 151 may be formed on the substrate 101, and the back side contact 120, the vertical contact 142b, and the first interconnection layer 141b may be formed. Finally, the image sensor 100j of the present embodiment may be fabricated by forming the back side insulating layer 153, the color filter 162, and the micro-lens 164.

Figure 9D:
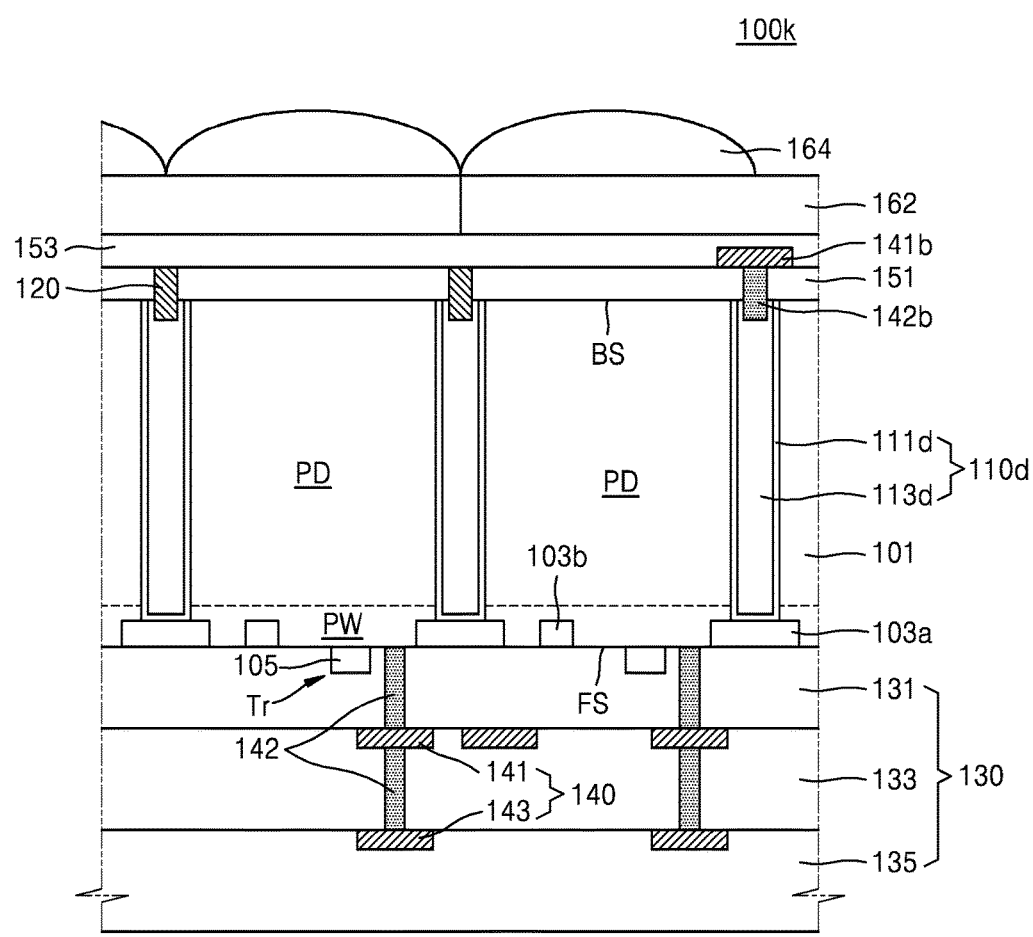

Referring to FIG. 9D, the image sensor 100k includes a pixel separation structure 110d different from the image sensor 100j of FIG. 9C. For example, the pixel separation structure 110d is in contact with an upper surface of the STI layer 103a without passing through the STI layer 103a. In addition, the pixel separation structure 110d includes a sidewall insulating layer 111d and a lower surface of the conductive layer 113d. The sidewall insulating layer 111d covers the lower surface of the conductive layer 113d. For example, the sidewall insulating layer 111d is in contact with the lower surface of the conductive layer 113d. In other words, the sidewall insulating layer 111d may extend from a side surface of the conductive layer 113d and cover a bottom surface of the conductive layer 113d.

The image sensor 100k may be fabricated by forming a deep trench in the back side BS of the substrate and filling the deep trench with the sidewall insulating layer 111d and the conductive layer 113d to form the pixel separation structure 110d. However, unlike the image sensor 100j of FIG. 9C, the deep trench need not penetrate the STI layer 103a but may be formed only up to a top surface of the STI layer 103a, and thereafter, the sidewall insulating layer 111d and the conductive layer 113d may be filled in the deep trench, thereby forming the pixel separation structure 110d.

Figure 9E:
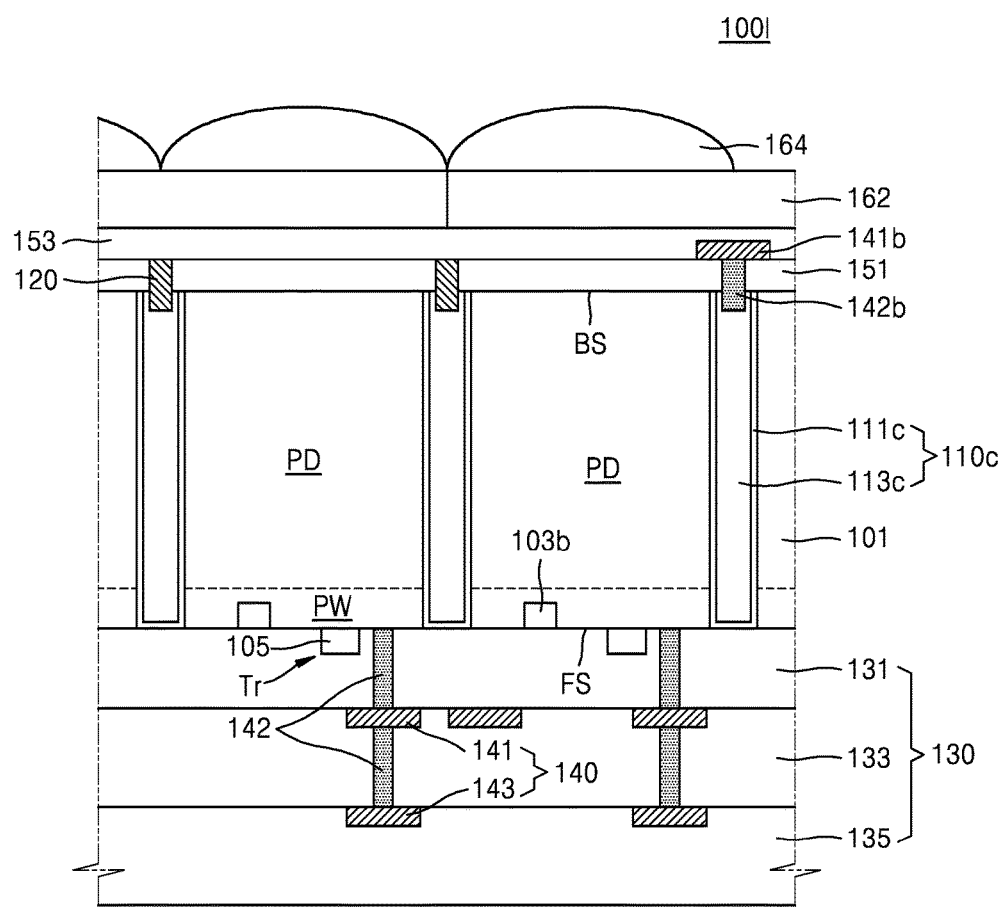

Referring to FIG. 9E, the image sensor 100l is different from the image sensor 100j of FIG. 9C. For example, the pixel separation structure 110c of FIG. 9E need not be coupled with the STI layer 103a of FIG. 9C. In other words, the STI layer 103a of FIG. 9C is not present in the image sensor 100j. The pixel separating structure 110c may be formed by forming a deep trench extending from the back side BS of the substrate 101 to the front side FS of the substrate 101 and filling the deep trench with the sidewall insulating layer 111c and the conductive layer 113c.

The present inventive concept is not limited to the exemplary embodiment described above. For example, in an image sensor in which a pixel separation structure of a grid structure is formed, the image sensor may include a back side contact with various structures that is in contact with a conductive layer of the pixel separation structure at a back side of a substrate. The back side contact may be arranged at a grid point portion of the pixel separation structure at the back side.

Figure 10:
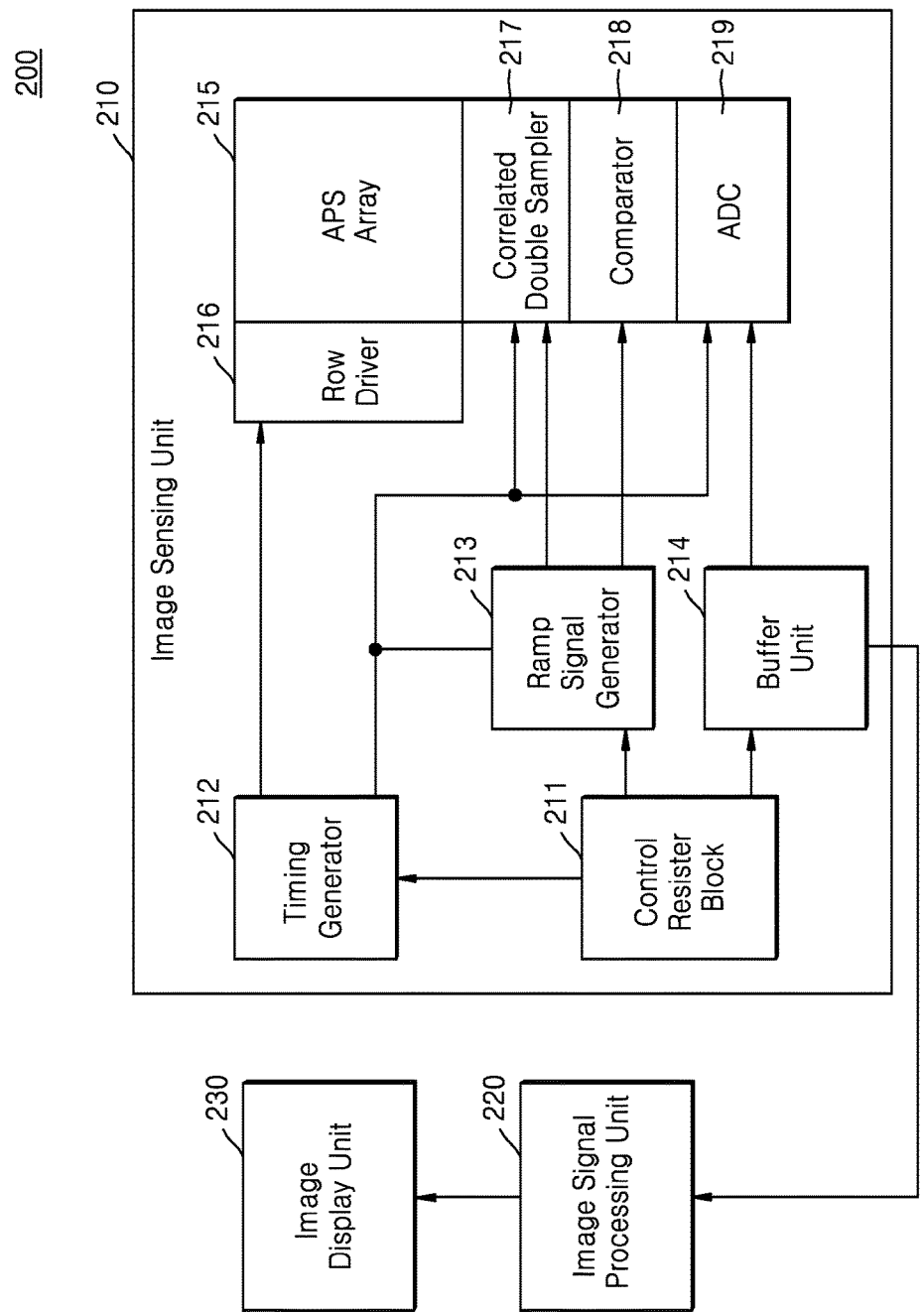
FIG. 10 is a schematic block diagram of a camera system including an image sensor according to an exemplary embodiment of the present inventive concept.

FIG. 10 is a schematic block diagram of a camera system 200 including an image sensor according to an exemplary embodiment.

Referring to FIG. 10, the camera system 200 includes an image sensing unit 210, an image signal processing unit 220, and an image display unit 230. The image sensing unit 210 includes a control resister block 211, a timing generator 212, a ramp signal generator 213, a buffer unit 214, an active pixel sensor (APS) array 215, a row driver 216, a correlated double sampler 217, a comparator 218, and an analog to digital converter (ADC) 219.

The control resister block 211 may control all operations of the camera system 200. The control resister block 211 may directly provide an operation signal to the timing generator 212, the ramp signal generator 213, and the buffer unit 214. The timing generator 212 may generate a signal used as a reference signal for an operation timing of components of the image sensing unit 210. The operation timing reference signal generated by the timing generator 212 may be applied to the row driver 216, the correlated double sampler 217, the comparator 218, or the ADC 219. The ramp signal generator 213 may generate a ramp signal used by the correlated double sampler 217 or the comparator 218 and apply the ramp signal to the correlated double sampler 217 or the comparator 218. The buffer unit 214 may include a latch unit. The buffer unit 214 may temporarily store an image signal to be transmitted to the outside of the buffer unit 214.

The APS array 215 may sense an external image. The APS array 215 may include a plurality of active pixels, and the APS areas of the image sensors 100, 100a~100l may be part of the APS array 215. The row driver 216 may selectively activate a row of the APS array 215. The correlated double sampler 217 may sample an analog signal generated by the APS array 215 and output the sampled analog signal. The comparator 218 may compare data provided from the correlated double sampler 217 with a slope of the ramp signal feedback in accordance with analog reference voltages to generate a variety of reference signals. The ADC 219 may convert analog image data to digital image data.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An image sensor comprising:
a substrate comprising a plurality of pixels arranged in a two-dimensional array structure, and having a front side and a back side opposite to the front side;
an interconnection arranged on the front side of the substrate;
an insulating layer, a color filter, and a micro-lens arranged on the back side of the substrate;
a pixel separation structure disposed in the substrate, wherein the pixel separation structure includes a conductive layer having a grid structure in a planar view of the image sensor and surrounding each of the plurality of pixels; and
a back side contact vertically overlapped with and electrically connected to a grid point portion of the grid structure of the conductive layer of the pixel separation structure.

2. The image sensor of claim 1,
wherein the pixel separation structure further comprises a plurality of sidewall insulating layers each of which is interposed between the conductive layer and one of the plurality of pixels and surrounds the one of the plurality of pixels, and
wherein the conductive layer penetrates the substrate to be electrically connected to the interconnection.

3. The image sensor of claim 2,
wherein a negative voltage or a ground voltage is applied to the conductive layer and the back side contact through the interconnection.

4. The image sensor of claim 1,
wherein a part of the back side contact is inserted into the grid point portion of the grid structure of the conductive layer.

5. The image sensor of claim 1,
wherein the back side contact comprises an upper head portion penetrating the insulating layer and a lower insertion portion inserted into the grid point portion of the grid structure of the conductive layer, and
wherein a width of the upper head portion is greater than a width of the lower insertion portion.

6. The image sensor of claim 1,
wherein an upper surface of the back side contact has one of a circular shape, an elliptical shape, a polygonal shape, and a cross shape.

7. The image sensor of claim 1,
wherein each of the plurality of pixels has a rectangular structure in the planar view of the image sensor,
wherein the plurality of pixels includes four pixels arranged in two rows and two columns,
wherein the back side contact is spaced apart from the four pixels, and
wherein the grid point portion of the grid structure of the conductive layer is positioned in a region of the conductive layer adjacent to the four pixels.

8. The image sensor of claim 1,
wherein a width of the back side contact is less than a width of the conductive layer.

9. The image sensor of claim 1,
wherein the insulating layer comprises an antireflection layer.

10. The image sensor of claim 2,
wherein each of the plurality of pixels includes a photodiode,
wherein the photodiode is surrounded by one of the plurality of sidewall insulating layers so that the photodiode is isolated from the conductive layer of the pixel separation structure.

11. The image sensor of claim 1,
wherein the conductive layer includes polysilicon, and
wherein the back side contact includes tungsten (W).

12. An image sensor comprising:
a plurality of pixels each comprising a photodiode disposed in a substrate and comprising a front side and a back side, the plurality of pixels being arranged in a first direction and a second direction to form an array structure in a planar view of the image sensor;

a pixel separation structure penetrating the substrate, wherein the pixel separation structure includes a plurality of sidewall insulating layers, and a conductive layer having a grid structure surrounding each of the plurality of sidewall insulating layers; and a plurality of back side contacts each partially inserted into one of a plurality of grid point portions of the grid structure of the conductive layer, wherein the plurality of grid point portions of the grid structure of the conductive layer is non-overlapped in the first direction and in the second direction with the plurality of pixels.

13. The image sensor of claim 12, further comprising:
an interconnection on the front side of the substrate,
wherein the conductive layer has an integrally connected structure and is electrically connected to the interconnection, and
wherein a negative voltage or a ground voltage is applied to the conductive layer and the plurality of back side contacts through the interconnection.

14. The image sensor of claim 12, further comprising:
an insulating layer on the back side of the substrate,
wherein each of the plurality of back side contacts comprises an upper head portion penetrating the insulating layer and a lower insertion portion inserted into one of the plurality of grid point portions of the grid structure of the conductive layer.

15. The image sensor of claim 14,
wherein the insulating layer includes hafnium oxide (HfOx),
wherein the conductive layer includes polysilicon, and
wherein the plurality of back side contacts includes tungsten (W).

16. The image sensor of claim 12,
wherein a number of the plurality of back side contacts is smaller than a number of the plurality of grid point portions.

17. An image sensor having a voltage source generating a voltage, comprising:
a substrate;
a plurality of photodiodes disposed in the substrate and arranged in a first direction and in a second direction intersecting the first direction in a planar view of the image sensor;
a pixel separation structure penetrating the substrate, and surrounding each of the plurality of photodiodes and separating the plurality of photodiodes from each other;
an interconnection electrically connected to the pixel separation structure and applied with the voltage having a negative voltage or a ground voltage; and
a plurality of back side contacts arranged in a third direction intersecting the first direction and the second direction in the planar view of the image sensor and electrically connected to the interconnection through the pixel separation structure,
wherein the plurality of back side contacts each is partially inserted in a region of the pixel separation structure, and
wherein the region of the pixel separation structure is surrounded by a predetermined number of the plurality of photodiodes.

18. The image sensor of claim 17,
wherein the pixel separation structure includes a plurality of sidewall insulating layers and a conductive layer penetrating the substrate to be electrically connected to the interconnection and surrounding each of the plurality of sidewall insulating layers, and
wherein the plurality of sidewall insulating layers each surrounds one of the plurality of photodiodes.

19. The image sensor of claim 18,
wherein the region of the pixel separation structure is part of the conductive layer,
wherein the region of the pixel separation structure is non-overlapped in the first direction and the second direction with plurality of photodiodes.

20. The image sensor of claim 17, further comprising:
an insulating layer covering the plurality of photodiodes and surrounding a sidewall of each of the plurality of back side contacts,
wherein the plurality of photodiodes is between the insulating layer and the interconnection, and
wherein the predetermined number of the plurality of photodiodes is four.

* * * * *